(12) United States Patent
Sakai

(10) Patent No.: US 7,033,925 B2
(45) Date of Patent: Apr. 25, 2006

(54) PATTERN TRANSFER MASK RELATED TO FORMATION OF DUAL DAMASCENE STRUCTURE AND METHOD OF FORMING DUAL DAMASCENE STRUCTURE

(75) Inventor: Junjirou Sakai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/442,960

(22) Filed: May 22, 2003

(65) Prior Publication Data

US 2004/0083444 A1    Apr. 29, 2004

(30) Foreign Application Priority Data

Oct. 24, 2002    (JP)    ............... 2002-309416

(51) Int. Cl.
   *H01L 21/4763*    (2006.01)
(52) U.S. Cl. ............ 438/637; 438/638; 438/640
(58) Field of Classification Search ........ 438/637, 438/638, 639, 640
   See application file for complete search history.

(56) References Cited

U.S. PATENT DOCUMENTS 6,355,399 B1 * 3/2002 Sajan et al. ............... 430/311
6,436,810 B1 * 8/2002 Kumar et al. ............. 438/633
6,656,644 B1 * 12/2003 Hasegawa et al. ........... 430/5

FOREIGN PATENT DOCUMENTS

| JP | 8-44038 | 2/1996 |
| JP | 11-307426 | 5/1999 |
| JP | 2000-58647 | 2/2000 |

OTHER PUBLICATIONS

I-Hsiung Huang, et al, "A Novel Multiple Resist Patterning Stacks for Dual Damascene Interconnection and Resolution-Enhanced Patterns", Proceedings of SPIE, vol. 4346, 2001, pp. 265-275.

* cited by examiner

*Primary Examiner*—Chuong Anh Luu
(74) *Attorney, Agent, or Firm*—Oblon, Spivak, McClelland, Maier & Neustadt, P.C.

(57) ABSTRACT

A mask pattern (110) of a pattern transfer mask (101) includes a light shielding pattern (111) and a light transmitting pattern (112). The light shielding pattern (111) has a shape (pattern) subjected to undersizing near portions corresponding to via holes (51H). It is desirable to make undersizing to a greater degree in a region where the via holes (51H) occupy a larger area. While the mask (101) is intended for a negative-type resist, the light shielding pattern (111) and the light transmitting pattern (112) may be changed in position with each other in a mask intended for a positive-type resist.

10 Claims, 13 Drawing Sheets

PATTERN TRANSFER MASK RELATED TO FORMATION OF DUAL DAMASCENE STRUCTURE AND METHOD OF FORMING DUAL DAMASCENE STRUCTURE

BACKGROUND OF THE INVENTION

1. Field of the Invention

The present invention relates to a pattern transfer mask for use in manufacture of a semiconductor device including dual damascene structures, and further relates to a method of manufacturing a semiconductor device using the pattern transfer mask.

2. Description of the Background Art

Copper (Cu) dual damascene structures have conventionally been employed for multilevel interconnection for semiconductor devices. Such structures are formed as described below. First, via holes are formed in an oxide film of a substrate. Thereafter, resist is coated entirely over the oxide film, and is patterned into a pattern that corresponds to trenches by exposure to light and development. An anti-reflection film may be deposited by coating or the like before coating resist for via holes or trenches. Next, the oxide film is etched using the patterned resist as a mask, thereby forming trenches. The trenches are formed over the via holes. Then, a Cu film is plated in the via holes and trenches, thereby completing a dual damascene structure.

Such dual damascene structure is introduced by Japanese Patent Application Laid-Open No. 2000-58647 (FIG. 4), for example.

With the above-described conventional method, resist is coated entirely over the oxide film in which the via holes are formed or over the anti-reflection film, and thus collects in the via holes. At this time, the thickness of resist (i.e., the thickness based on the surface of part of the oxide film where no via hole is formed) tends to be small over the via holes. Besides, the resist collects in the via holes in different manners depending on the layout of the via holes. Thus, the resist varies in thickness in an area where no via hole is formed, an area where many via holes are opened and an area where less via holes are opened.

Likewise, in the case where the anti-reflection film is deposited by coating on the oxide film in which via holes are formed, the anti-reflection film varies in thickness depending on the layout of the via holes.

If resist varies in thickness in light transfer, a finished dimension of a resist pattern after development varies due to standing wave effect (interference effect) and bulk effect (absorbing effect) even with the same amount of exposure. That is, a problem arises in that a trench pattern of a desired dimension cannot be obtained resulting from the presence and layout of via holes.

Likewise, when the anti-reflection film varies in thickness, a trench pattern of a desired dimension cannot be obtained resulting from variations in reflectance.

Further, exposure light generally varies in reflectance in an area where via holes are present and an area where via holes are absent, which causes effective exposure to vary even with the same amount of exposure. In this case, a trench pattern of a desired dimension cannot be obtained, similarly to the above-described cases.

As a result of the above-described drawback, if finished trenches are narrower than desired, increase in wiring resistance and breaks easily occur. Conversely, if finished trenches are wider than desired, wiring resistance becomes lower than a design value and adjacent interconnect lines are short-circuited. That is, designed operations cannot be obtained in semiconductor devices.

SUMMARY OF THE INVENTION

An object of the present invention is to provide a pattern transfer mask capable of reducing the above-described pattern abnormalities in the vicinity of holes in a resist pattern after development and further, a method of manufacturing a semiconductor device using the pattern transfer mask and a computer program for making a mask pattern for the pattern transfer mask.

According to the present invention, the pattern transfer mask is for transferring a pattern to resist when manufacturing a semiconductor device. The semiconductor device includes, in one layer, a plurality of dual damascene structures each including at least one hole, a trench extending over the at least one hole and a conductive material buried in the at least one hole and the trench. The pattern transfer mask is used when patterning the resist for forming the trenches. The pattern transfer mask includes a light shielding pattern subjected to one of undersizing and oversizing in the vicinity of a portion that corresponds to each of the holes and a light transmitting pattern having higher light transmittance than the light shielding pattern.

Pattern abnormalities (shape abnormalities) can be reduced in the vicinity of the holes in the developed resist pattern, which thus can reduce shape abnormalities of the trenches and the conductive material buried in the trenches.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
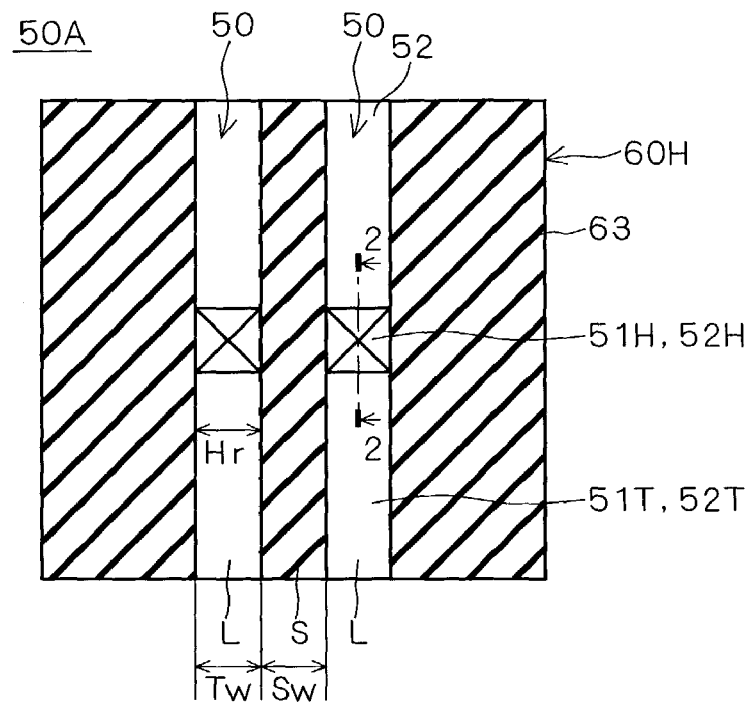
FIG. 1 is a layout design view of a semiconductor device including dual damascene structures, illustrating a pattern transfer mask according to a first preferred embodiment of the present invention.
Figure 2:
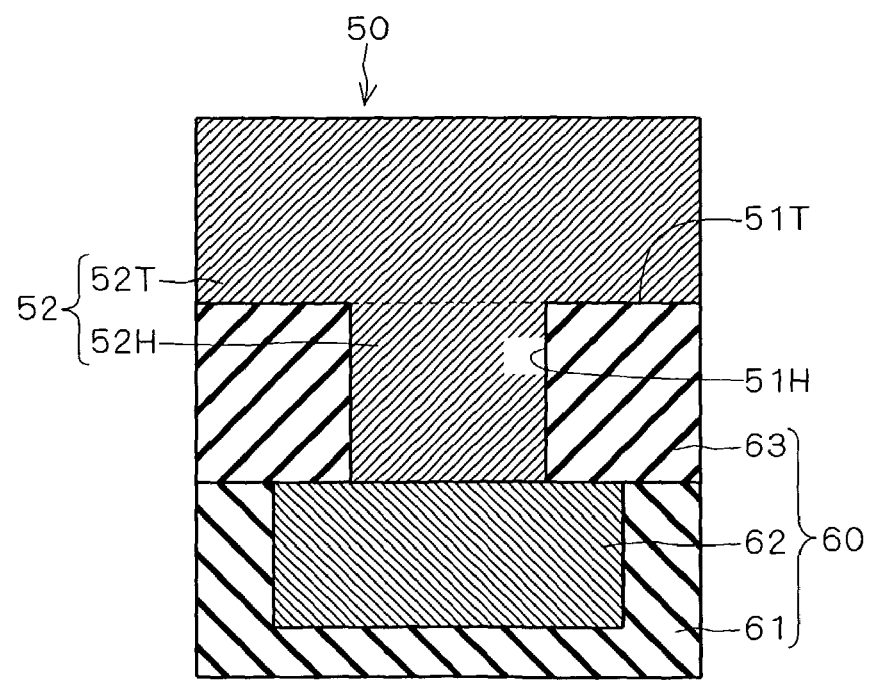
FIG. 2 is a sectional view illustrating the dual damascene structure.

First, a semiconductor device 50A including dual damascene structures 50 will be described referring to the design layout view of FIG. 1 and the sectional view of FIG. 2. In FIG. 1, via holes 51H are each illustrated by a rectangular marked by a cross. FIG. 2 is the sectional view taken along the line 2—2 of FIG. 1.

The semiconductor device 50A includes two dual damascene structures 50 in the same layer. The dual damascene structures 50 each include a substrate 60, a via hole 51H, a trench 51T and a metal (or conductive material) 52 buried in the via hole 51H and trench 51T. The trench 51T extends over the via hole 51H (i.e., overlaps the via hole 51H in plan view) and is connected to the via hole 51H. In other words, the buried metal 52 has an interconnect line portion 52T in the trench 51T and a via portion 52H in the via hole 51H. The interconnect line portion 52T extends over the via portion 52H and is in contact with the via portion 52H. In the semiconductor device 50A, the dual damascene structures 50 are described as each having one via hole 51H and one trench 51T, however, one trench 51T and a plurality of via holes 51H may be provided (cf. FIG. 14 which will be described later).

As shown in FIGS. 1 and 2, the dual damascene structures 50 are each formed in the substrate 60. The substrate 60 will be described here as including an interlevel dielectric (interlayer dielectric) 61, a lower interconnect line 62 and an interlevel dielectric 63, as an example. Specifically, the lower interconnect line 62 is provided in the surface of the interlevel dielectric 61, and the interlevel dielectric 63 is provided on the surface of the interlevel dielectric 61. Although illustrated in one layer in FIG. 2 for ease of description, the interlevel dielectric 63 may be a multilayer film including a stopper film or a hard mask.

Then, the dual damascene structure 50 is formed in the interlevel dielectric 63. Specifically, in the interlevel dielectric 63, the via hole 51H is provided on the side of the lower interconnect line 62, and the trench 51T is provided on the side far from the lower interconnect line 62. The trench 5T is opened on the surface of the interlevel dielectric 63 (on the side far from the lower interconnect line 62), and is connected to the via hole 51H in the interlevel dielectric 63. The via hole 51H reaches the lower interconnect line 62.

The via hole 51H and trench 51T are filled with the buried metal 52. The buried metal 52 is made of, e.g., copper (Cu), or may further include a barrier metal film provided in contact with the interlevel dielectric 63 and lower interconnect line 62 in the trench 51T and via hole 51H. Accordingly, the buried metal 52 is constituted by the interconnect line portion 52T in the trench 51T and via portion 52H in the via hole 51H. The interconnect line portion 52T is electrically connected to the lower interconnect line 62 through the via portion 52H.

As shown in FIG. 1, two interconnect line portions 52T (i.e., two trenches 51T) extend in parallel, constituting a line-and-space pattern with interconnect line portions 52T indicated as line portions L and part of the interlevel dielectric 63 interposed between the interconnect line portions 52T indicated as a space portion S. In plan view, two via holes 51H are aligned with the space portion S interposed therebetween in the direction perpendicular to the extending direction of the trenches 51T. In the example shown here, width Sw of the space portion S is 0.20 μm, width Tw of the trench 51T (i.e., width of interconnect line portion 52T or line portion L) is 0.22 μm, and diameter Hr of the via hole 51 is 0.22 μm, in design. In this example, the width Tw is uniform throughout the trench 51T in design, and the same applies to the width Sw. Although described here as equal to the diameter Hr of the via hole 51H as shown in FIG. 1, the width Tw of the trench 51T may differ from the diameter Hr in dimension.

Figure 3:
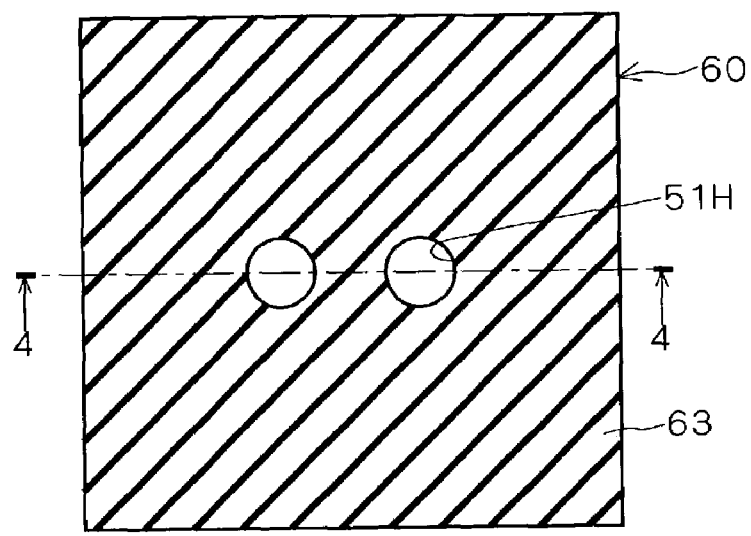
FIG. 3 is a plan view illustrating a substrate after forming via holes therein.

Next, referring to FIGS. 3 to 5 as well as FIGS. 1 and 2, a method of manufacturing the semiconductor device 50A, particularly a method of forming the dual damascene structure 50, will be described. First, the interlevel dielectric 63 is formed entirely over the interlevel dielectric 61 and the lower interconnect line 62. Next, resist is coated entirely over the interlevel dielectric 63, and a pattern for the via holes 51H is transferred to the resist by photolithography, and the resist is patterned. Then, the interlevel dielectric 63 is etched using the patterned resist as a mask, thereby forming the via holes 51H in the interlevel dielectric 63 (cf. the plan view of FIG. 3). The resist is thereafter removed.

Figure 4:
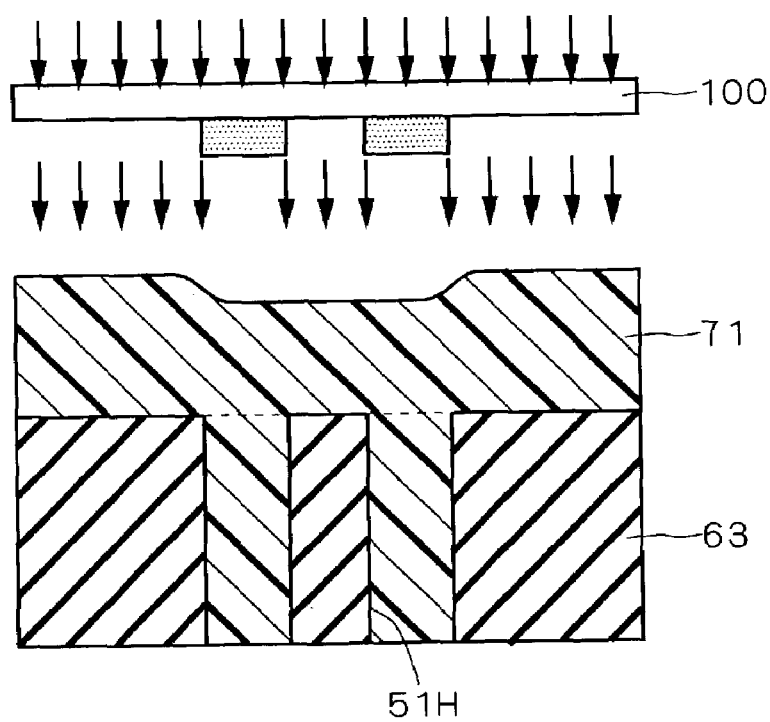
FIG. 4 is a sectional view illustrating a method of forming trenches.
Figure 5:
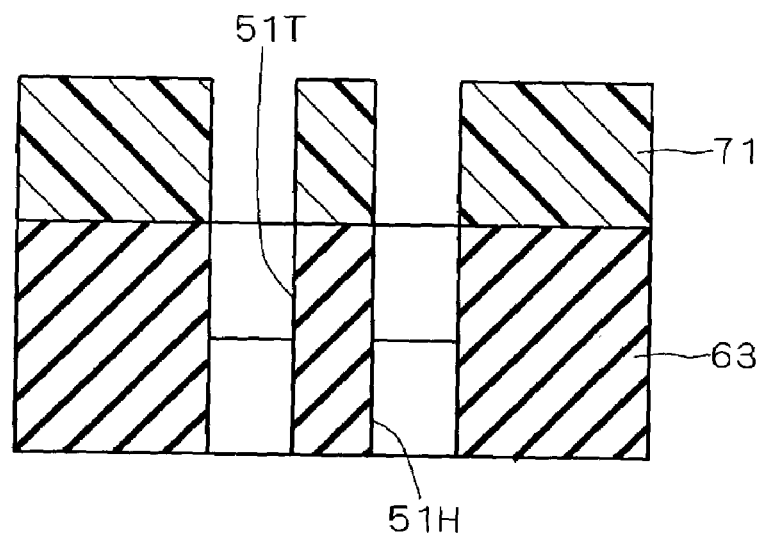
FIG. 5 is a sectional view illustrating the substrate after forming trenches therein.

Next, as shown in the sectional view of FIG. 4 (a section taken along the line 4—4 of FIG. 3), a negative-type resist 71 is coated on the entire surface so as to fill the via holes 51H, and is patterned by photolithography. Specifically, exposure light (e.g., KrF light of wavelength 248 nm) is radiated to the resist 71 through a pattern transfer mask (hereinafter also simply referred to as "mask") 100 to transfer a pattern corresponding to the trenches 51T to the resist 71. Thereafter, the resist 71 is developed. Then, the interlevel dielectric 63 is etched using the patterned resist 71 as a mask (resist mask), thereby forming the trenches 51T as shown in the sectional view of FIG. 5. Thereafter, the resist 71 is removed. As described, the pattern transfer mask 100 is used to pattern the resist 71 for forming the trenches 51T.

A copper (Cu) film, for example, is buried in the trenches 51T and via holes 51H by plating, and part of the copper film existing over the interlevel dielectric 63 is removed by CMP (chemical mechanical polishing), for example. The buried metal 52 is thereby formed.

Figure 6:
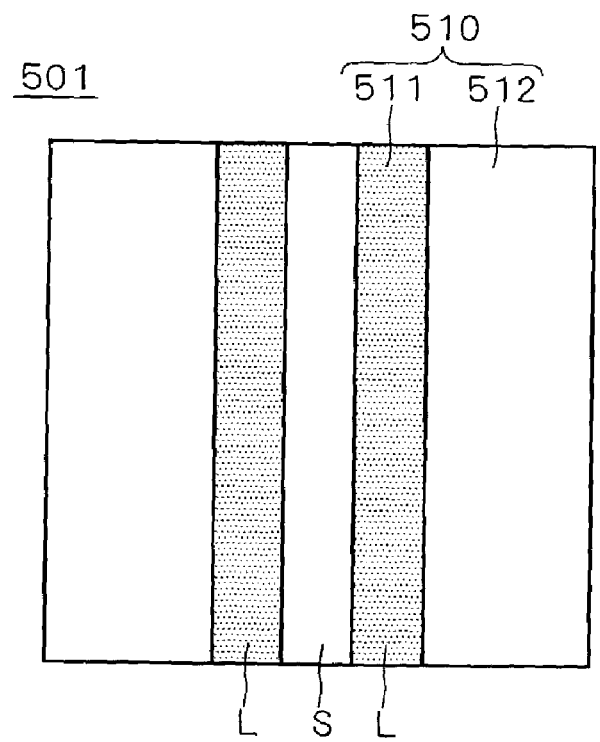
FIG. 6 is a plan view illustrating a pattern transfer mask for comparison.

Description will now be made on the case where a mask 501 for comparison shown in the plan view of FIG. 6 is used as the mask 100 shown in FIG. 4. For ease of description, portions that correspond to the above-described line portions L and space portion S of the semiconductor device 50A are designated by the reference characters "L" and "S", respectively, in FIG. 6 and drawings thereafter.

A mask pattern 510 of the mask 501 includes, in plan view, a light transmitting pattern 512 capable of sufficiently transmitting exposure light and a light shielding pattern 511 having lower transmittance (or transmissivity, or transmission coefficient) to exposure light than the light transmitting pattern 512. The mask 501 is intended for the negative-type resist 71. Exposure light transmitted through the light transmitting pattern 512 is radiated to the resist 71 (which inherently dissolves in a developing solution) (i.e., the mask pattern 510 is transferred to the resist 71), whereby a radiated portion is made insoluble in the developing solution. Thus, a pattern that corresponds to the light transmitting pattern 512 in the resist 71 remains after development and becomes a resist pattern (resist image).

In the mask 501, portions that correspond to the trenches 51T in the light shielding pattern 511 (i.e., portions that correspond to the above-described line portions L) each have a strip form in uniform width similarly to the design pattern of the trenches 51T shown in FIG. 1. Accordingly, a portion that corresponds to the above-described space portion S in the light transmitting pattern 512 also has a strip form in uniform width.

Figure 7:
FIG. 7 is a plan view illustrating a resist pattern formed with the pattern transfer mask shown in FIG. 6.

Using the mask 501 with the portion corresponding to the space portion S being set in the same width of 0.20 µm as the design value of the space portion S, the width of the portion corresponding to the space portion S in the developed resist pattern was 0.20 µm as designed in an area where the via hole 51H are absent in the neighborhood, but was 0.17 µm at the side of the via holes 51H. That is, as shown in the plan view (SEM image) of FIG. 7, the portion corresponding to the space portion S in the resist pattern is narrower than the design value of the space portion S in the vicinity of the via holes 51H. In other words, the portions that correspond to the trenches 51T are wider than the design value of the trenches 51T in the vicinity of the via holes 51H.

Figure 8:
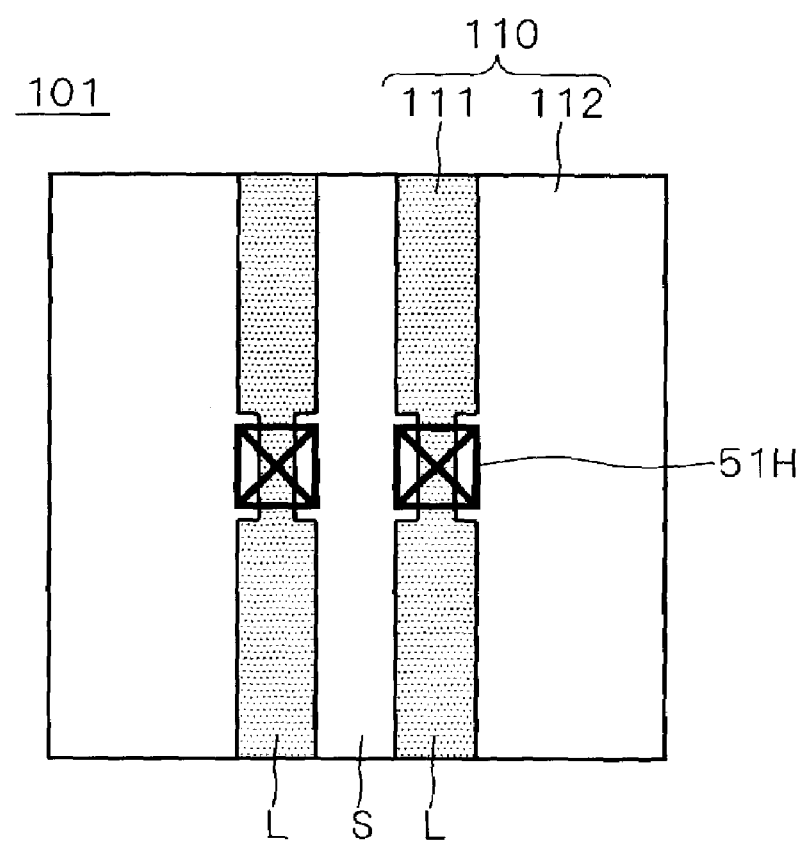
FIG. 8 is a plan view illustrating the pattern transfer mask according to the first preferred embodiment.
Figure 9:
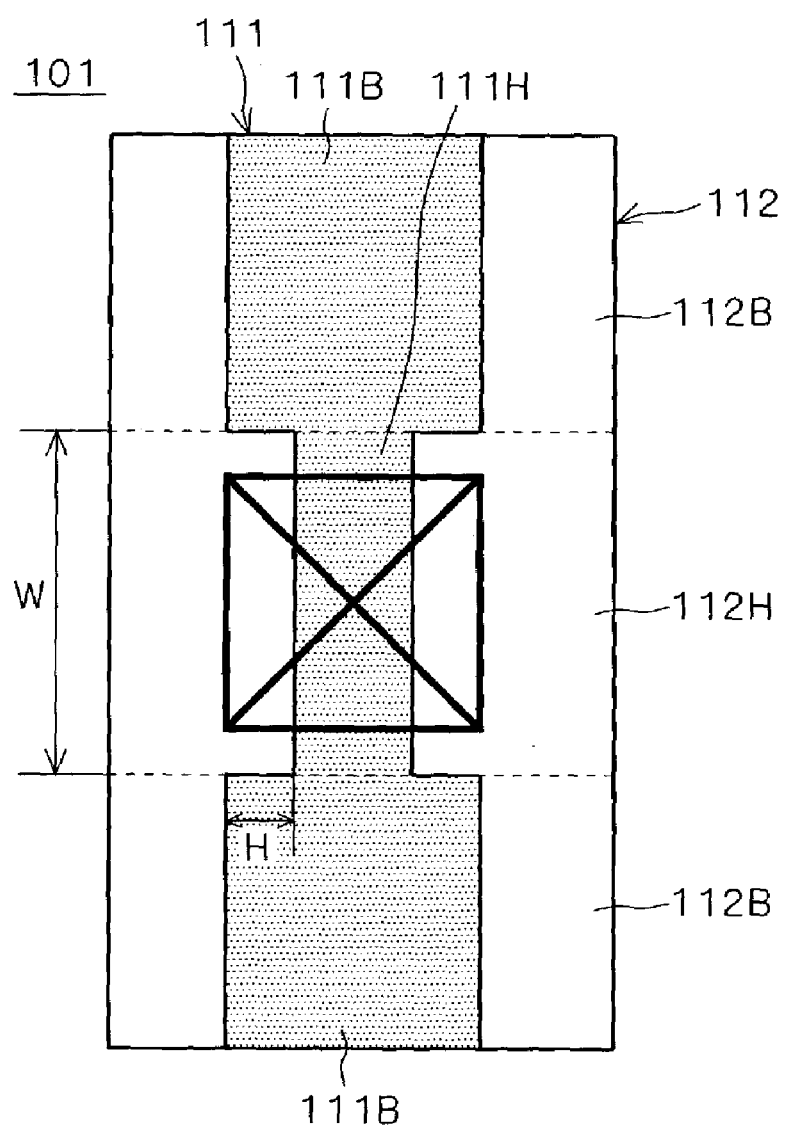
FIG. 9 is a partially enlarged view of FIG. 8.

In contrast, a pattern transfer mask 101 according to the present embodiment shown in the plan view of FIG. 8 can reduce the above-described pattern abnormalities (shape abnormalities). The mask 101 will hereinafter be described in detail referring to FIG. 8 and FIG. 9 which is a partially enlarged view of FIG. 8. In FIGS. 8 and 9, the layout design of the via holes 51H is also illustrated for the sake of description.

A mask pattern 110 of the mask 101 includes, in plan view, a light transmitting pattern 112 capable of sufficiently transmitting exposure light and a light shielding pattern 111 (made of, e.g., Cr or MoSi) having lower transmittance to exposure light than the light transmitting pattern 112. The mask 101 differs from the mask 501 for comparison shown in FIG. 6 in pattern shape as will be described later. The mask 101 is intended for the negative-type resist 71 similarly to the mask 501. Exposure light transmitted through the light transmitting pattern 112 is radiated to the resist 71 (i.e., the mask pattern 110 is transferred to the resist 71), whereby part of the resist 71 that corresponds to the light transmitting pattern 112 becomes a resist pattern after development.

Particularly, the light shielding pattern 111 of the mask 101 has a shape (pattern) subjected to undersizing (width reducing) in the vicinity of the portion that corresponds to the via hole 51H in the light shielding pattern 511 of the mask 501 for comparison shown in FIG. 6. That is, as shown in FIGS. 8 and 9, the light shielding pattern 111 has base portions 111B and undersized portions 111H. The base portions 111B each have the design width Tw of the trench 51T (i.e., the interconnect line portion 52T or line portion L).

Each of the undersized portions 111H is narrower in width than the base portions 111B (depressed with respect to the base portions 111B in plan view), and is provided in the portion that corresponds to the via hole 51H.

Conversely saying, the light transmitting pattern 112 of the mask 101 has a shape (pattern) subjected to oversizing (width increasing) in the vicinity of the portion that corresponds to the via hole 51H in the light transmitting pattern 512 of the mask 501 for comparison shown in FIG. 6. That is, as shown in FIGS. 8 and 9, the light transmitting pattern 112 has base portions 112B and oversized portions 112H. The base portions 112B each have the same width as the light transmitting pattern 512 shown in FIG. 6. The oversized portions 112H each project toward the light shielding pattern 111 with respect to the base portions 112B. The base portions 111B and undersized portion 111H are adjacent to the base portions 112B and oversized portion 112H, respectively.

Figure 10:
FIG. 10 is a plan view illustrating a resist pattern formed with the pattern transfer mask according to the first preferred embodiment.

Specifically, when an undersized dimension H (cf. FIG. 9) as depressed dimension of the edge of the undersized portion 111H with respect to the edges of the base portions 111B in the light shielding pattern 111 was set in 0.01 µm and a dimension W (cf. FIG. 9) of the undersized portion 111H along the extending direction of the light shielding pattern 111 was set in 0.20 µm, the width of the portion that corresponds to the space portion S in the resist pattern was made 0.186 µm (cf. the plan view (SEM image) of FIG. 10). In this case, the two edges of the undersized portion 111H opposite to each other interposing therebetween the portion corresponding to (a central portion of) the via hole 51H in the light shielding pattern 111 were subjected to undersizing, thereby setting the undersized portion 111H in a width of 0.20 µm and the oversized portion 112H at a portion that corresponds to the space portion S in the light transmitting pattern 112 in a width of 0.22 µm.

The above-described undersized dimension H is also a projecting dimension of the edges of the oversized portion 112H with respect to the edges of the base portions 112B. The above-described dimension W is also a dimension of the oversized portion 112H along the extending direction of the light shielding pattern 111.

As has been described, the mask 101 can reduce pattern abnormalities in the vicinity of the via hole 51H in the resist pattern. This can reduce shape abnormalities, specifically, increase in width of the trenches 51T and the interconnect line portions 52T in the trenches 51T, which solves the problem that the resistance of the interconnect line portion 52T is lower than a design value and adjacent ones of the interconnect line portions 52T are short-circuited. That is, designed operations can be obtained in the semiconductor device 50A.

Figure 11:
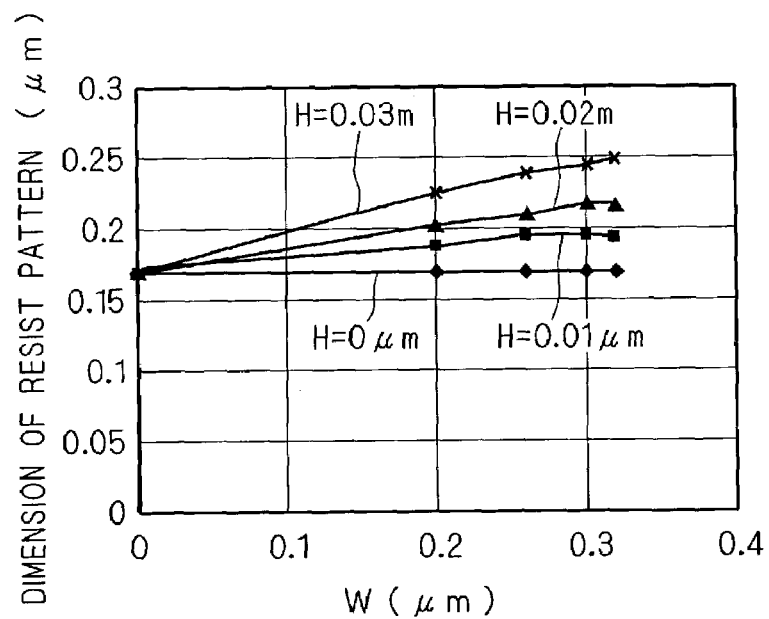
FIG. 11 is a graph illustrating the pattern transfer mask according to the first preferred embodiment.

The results obtained by studying various combinations of the above-described dimensions H and W in the mask 101 are plotted on the graph of FIG. 11. FIG. 11 shows that, as the dimensions H and W increase, the width of the portion that corresponds to the space portion S in the vicinity of the via hole 51H in the resist pattern increases, and the variations exhibit a tendency toward saturation with increase in the dimension W. In this case, when H=0.02 µm and W=0.26 µm, for example, a width of 0.20 µm as designed was obtained in the vicinity of the via hole 51H in the resist pattern, whereby the space portion S was obtained at a design value.

Figure 12:
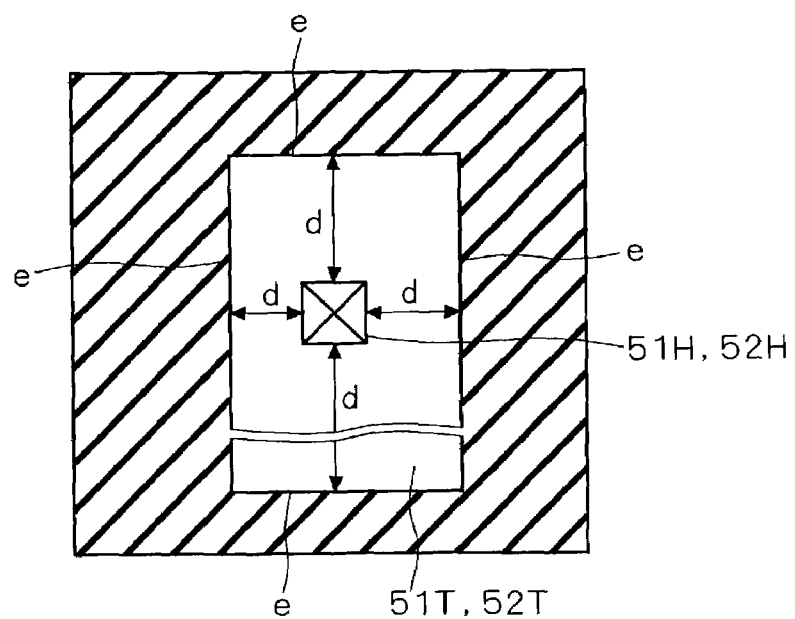
FIG. 12 is a schematic view illustrating spaces between edges of a via hole and those of an interconnect line.

Further, experiments conducted by the inventor have revealed that the above-described pattern abnormalities can be reduced to a practical level by sizing (width changing) in an area on the layout design view (FIG. 1) where distance d (cf. the schematic view of FIG. 12) between an edge of the via hole 51H and an edge e of the trench 51T (or the interconnect line portion 52T) (cf. FIG. 12) is not greater than 70 nm.

Figure 13:
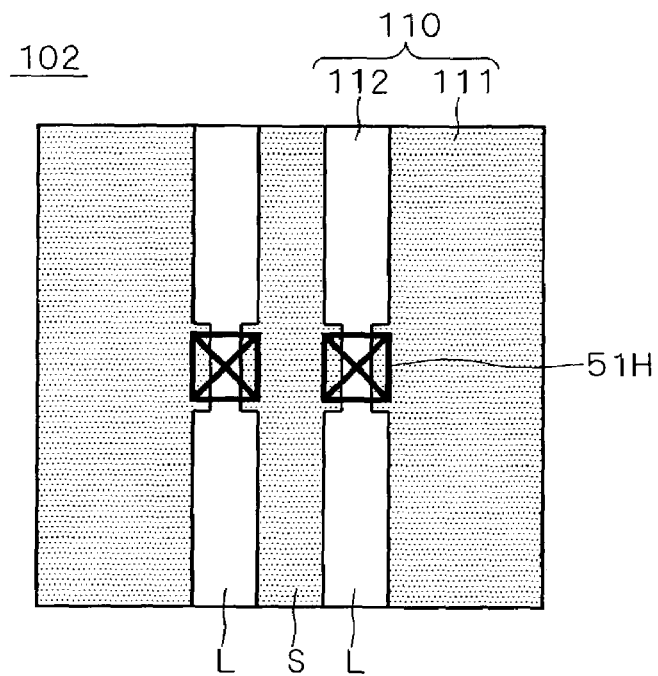
FIG. 13 is a plan view illustrating another pattern transfer mask according to the first preferred embodiment.

Although the above description has been directed to the case of the negative-type resist 71, a mask 102 shown in the plan view of FIG. 13 may be applied to a positive-type resist. Specifically, as is apparent from the comparison between FIGS. 8 and 13, the mask 102 has the mask pattern 110 of the mask 101 with the light shielding pattern 111 and light transmitting pattern 112 changed in position with each other. The light shielding pattern 111 of the mask 102 is subjected to oversizing in the vicinity of the portion that corresponds to the hole 51H; conversely, the light transmitting pattern 112 of the mask 102 is subjected to undersizing in the vicinity of the portion that corresponds to the hole 51H. In FIG. 13, the design layout of the via holes 51H is also illustrated for the sake of description.

The above-described mask 102 can achieve the same effects as the mask 101. This can reduce shape abnormalities, specifically, decrease in width of the trenches 51T and the interconnect line portions 52T in the trenches 51T, which solves the problem of increase in resistance and breaks of the interconnect line portions 52T. That is, designed operations can be obtained in the semiconductor device 50A.

Second Preferred Embodiment

Figure 14:
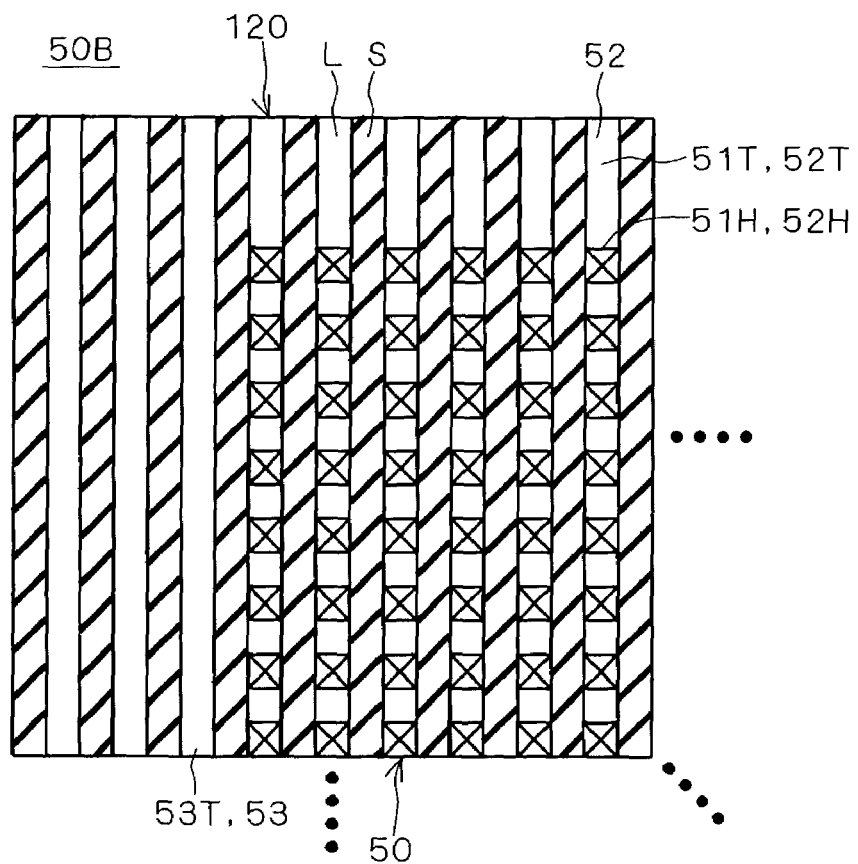
FIG. 14 is a layout design view of a semiconductor device including dual damascene structures, illustrating a pattern transfer mask according to a second preferred embodiment of the present invention.

First, a semiconductor device 50B including the dual damascene structures 50 will be described referring to the design layout view of FIG. 14. As shown in FIG. 14, the semiconductor device 50B includes a plurality of dual damascene structures 50 in the same layer. In the semiconductor device 50B, the dual damascene structures 50 are each provided with a plurality of via holes 51H per trench 51T. Further, the semiconductor device 50B includes a plurality of trenches 53T provided in the same layer as the trenches 51T, extending in parallel to the trenches 51T. An interconnect line 53 is provided in each of the trenches 53T. Specifically, a line-and-space region 120 is formed in an area of 20 μm square where the line portion L of 0.20 μm, that corresponds to the interconnect line portion 52T and interconnect line 53 (i.e., trenches 51T and 53T), and the space portion S of 0.20 μm are arranged alternately with each other. The trenches 53T are provided on the edge of the line-and-space region 120. The via holes 51H of diameter of 0.20 μm constituting the dual damascene structures 50 are aligned vertically and horizontally at a pitch of 0.40 μm. At this time, adjacent ones of the via holes 51H are aligned in the direction perpendicular to the extending direction of the trenches 51T with the space portion S interposed therebetween.

Figure 15:
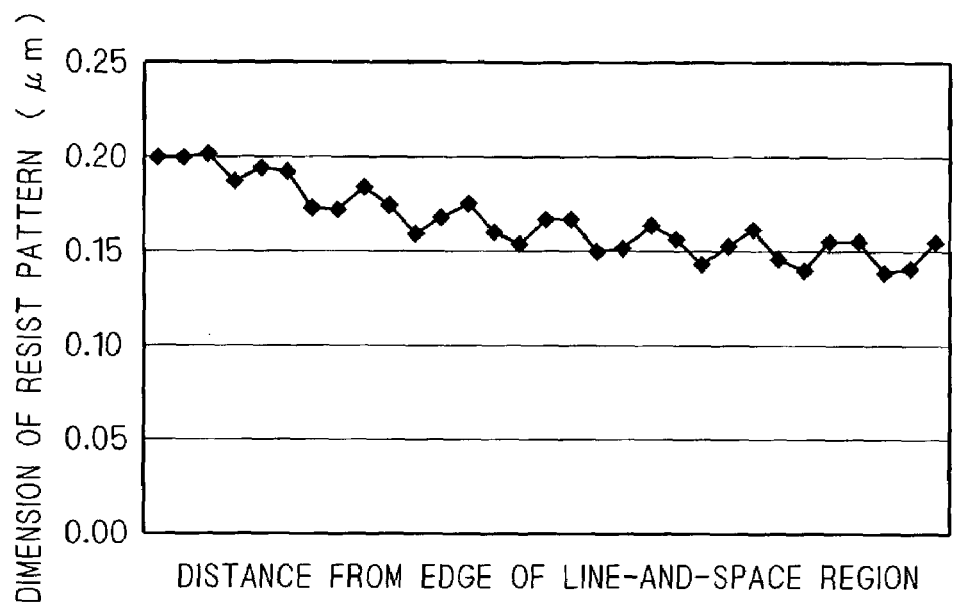
FIG. 15 is a graph illustrating a resist pattern formed with a pattern transfer mask for comparison.

Here, the negative-type resist 71 (cf. FIGS. 4 and 5) was patterned using a mask for comparison not subjected to sizing similarly to the mask 501 (cf. FIG. 6) for forming the above-described trenches 51T and 53T, whereby results plotted in the graph of FIG. 15 were obtained. That is, the results show the tendency that the width of a resist pattern (corresponding to the space portion S in the semiconductor device 50B) formed with the mask for comparison was 0.20 μm as a design value in the vicinity of the edge of the region 120 where the via holes 51H are absent, but was made narrower toward the central portion of the region 120 where the via holes 51H are present. This can be attributed to the fact that the resist 71 is coated to fill the via holes 51H, so that the film thickness of the resist 71 is thin on the interlevel dielectric 63 in the central portion of the region 120 where the via holes 51H are present (cf. FIG. 4), whereby the bulk effect of the resist 71 causes variations in effective exposure.

Figure 16:
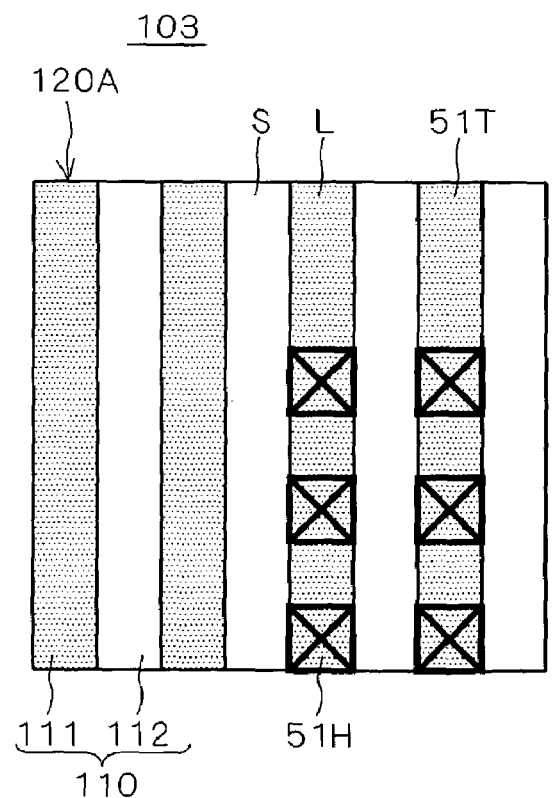
FIGS. 16 to 18 are plan views illustrating the pattern transfer mask according to the second preferred embodiment.
Figure 17:
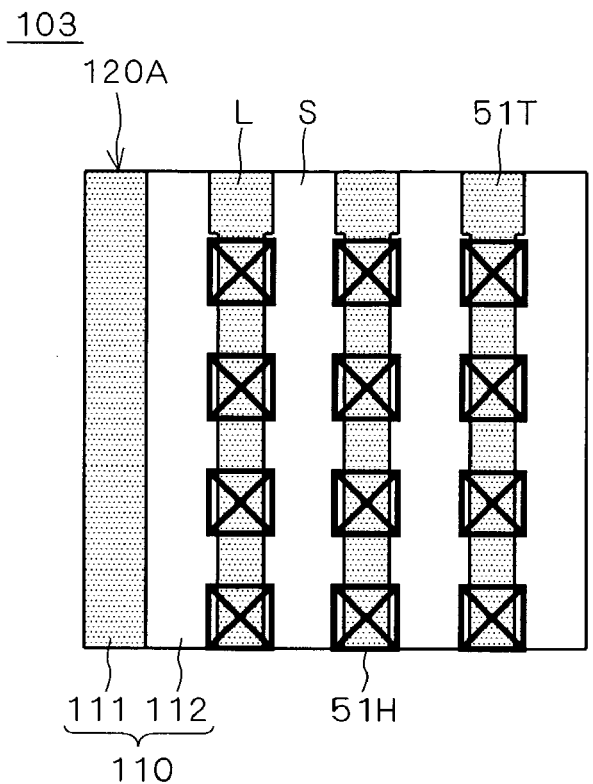
Figure 18:
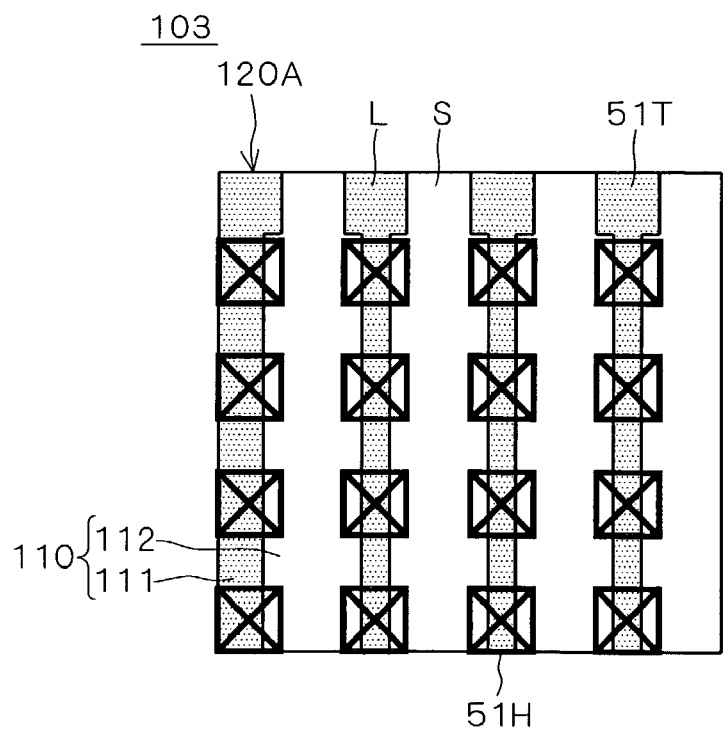

Based on the above experimental results, a mask 103 according to the present embodiment is provided with the mask pattern 110 as shown in the plan views of FIGS. 16 to 18 (each being a partially enlarged view of the mask 103). In FIGS. 16 to 18, the design layout of the via holes 51H is also illustrated for the sake of description.

Specifically, the light shielding pattern 111 of the mask 103 has a pattern corresponding to the line portions L (i.e., the trenches 51T and 53T) in the semiconductor device SOB and is subjected to undersizing in the vicinity of the portion that corresponds to the via hole 51H, as is basically the same as the aforementioned mask 101 (cf. FIGS. 8 and 9). Particularly, the semiconductor device SOB, or more specifically, the layer in which the trenches 51T and 53T are provided, is divided into a plurality of regions 120A in plan view (cf. FIG. 14), and then undersizing is made to a greater degree in a region 120A where the occupation ratio of the via holes 51H (i.e., the ratio of the whole area of the via holes 51H in the region 120A to the area of the region 120A) is higher. For instance, the above-described line-and-space region 120 of 20 μm square is supposed to be divided into a plurality of regions 120A of 2 μm square, and the occupation ratio of the via holes 51H in each of the regions 120A is calculated. When the occupation ratio is between 0 and 10%, the regions 120A are not subjected to sizing (width changing) as shown in FIG. 16; when between 10 and 18%, the regions 120A are subjected to undersizing with undersized dimension H (cf. FIG. 9)=0.01 μm as shown in FIG. 17; and when between 18 and 25%, the regions 120A are subjected to undersizing with H=0.02 μm as shown in FIG. 18. Needless to say, as shown in FIGS. 17 and 18, the light transmitting pattern 112 is subjected to oversizing in accordance with the shape of the light transmitting pattern 111. In the cases shown in FIGS. 16 to 18, the plurality of undersized portions provided correspondingly to each trench 51T are integrated with each other (continue integrally).

When the negative-type resist 71 was patterned using the mask 103 having the above-described mask pattern 110 as the mask 100 shown in FIG. 4, the width of the resist pattern was made 0.20±0.02 μm at any position in the line-and-space region 120. That is, the mask 103 can reduce pattern abnormalities of the resist pattern dependent on the layout of the via holes 51H (e.g., density of the via holes 51H).

Even when the design layout is different from that of FIG. 14, e.g., when the trenches 53T are arranged alternately with the trenches 51T of the dual damascene structure 50, a technique similar to that with the mask 103 is applicable.

The aforementioned graph of FIG. 15 reveals that the width of the resist pattern formed with the mask for comparison decreases while oscillating with an amplitude of about 0.02 μm. The graph of FIG. 19 also shows similar oscillation. This can be attributed to the fact that the film thickness of the resist 71 is thin on the interlevel dielectric 63 in an area where the via holes 51H are present, whereby the standing wave effect and the bulk effect resulting from variations in film thickness causes effective exposure to vary.

Figures 19, 20:
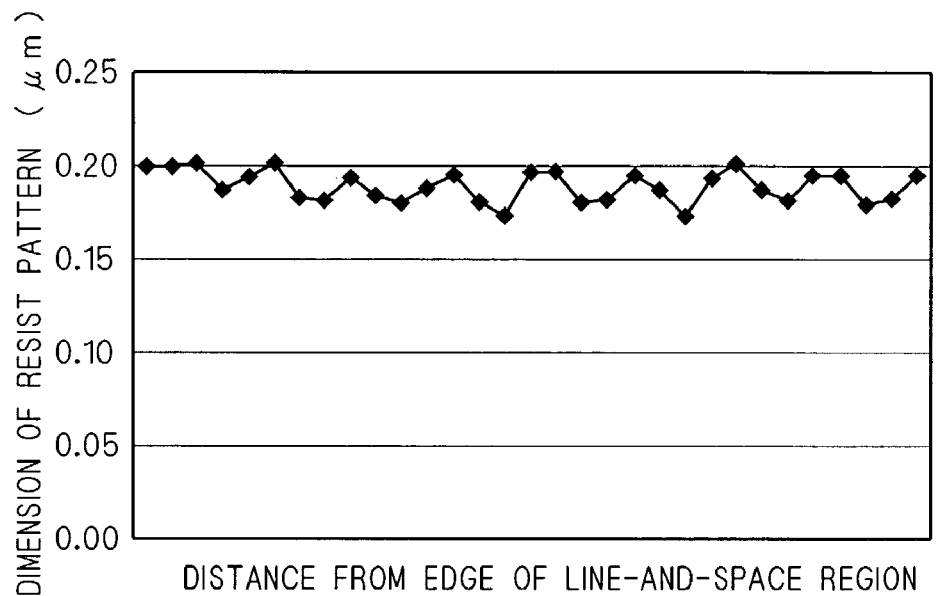
FIG. 19 is a graph illustrating the pattern transfer mask according to the second preferred embodiment.
FIG. 20 is a sectional view illustrating a method of manufacturing the semiconductor device including dual-damascene structures according to the second preferred embodiment.
Figure 21:
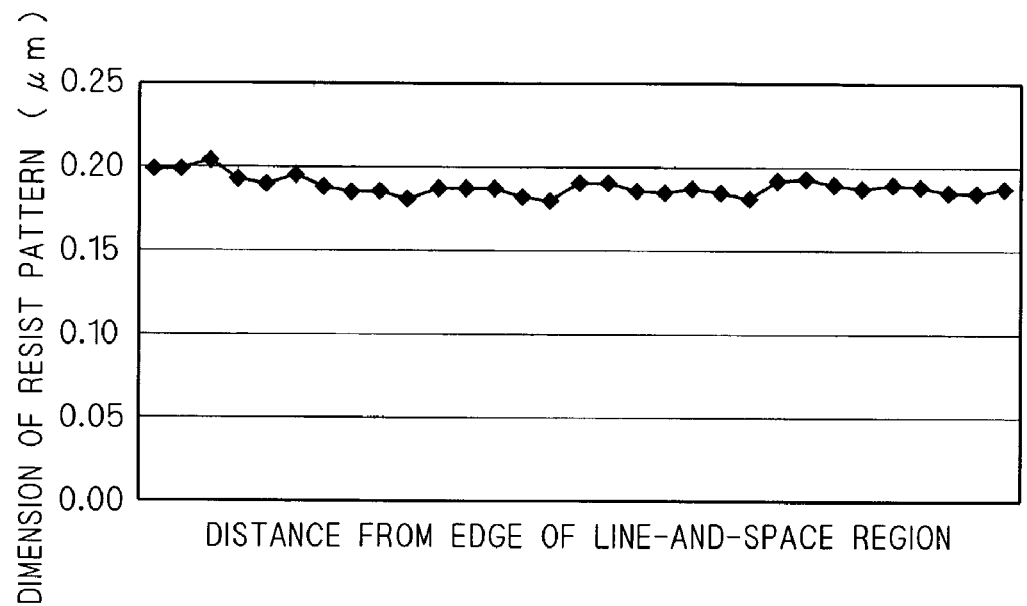
FIG. 21 is a graph illustrating the method of manufacturing the semiconductor device including dual-damascene structures according to the second preferred embodiment.

Therefore, as shown in the sectional view of FIG. 20, the resist 71 was exposed to light using the mask 103 as the mask 100 after forming an anti-reflection film 72 on an uncoated surface of the resist 71, whereby the width of the resist 71 was made 0.20±0.01 μm at any position in the line-and-space region 120 as shown in the graph of FIG. 21. The anti-reflection film 72 may be used together with the mask 101 or 102. In that case, dimensional accuracy of the resist pattern can be improved as with the case of the mask 103.

As with the case of the masks 101 and 102 shown in FIGS. 8 and 13, respectively, a mask for a positive-type resist can be obtained by changing the light shielding pattern 111 and light transmitting pattern 112 in position with each other in the mask 103.

Variations of the First and Second Preferred Embodiments

The dual damascene structure 50 is also applicable to the case where the lower interconnect line 62 in FIG. 2 is an impurity region (e.g., source/drain region of a MISFET (Metal Insulator Semiconductor Field Effect Transistor)) formed in a semiconductor substrate, to which the description in the first and second preferred embodiments can be applied. In this case, via holes are also called contact holes. Thus, via holes and contact holes will hereinafter be generically called "holes".

Further, exposure light is not limited to the above-described KrF light, but may be light of other wavelengths. For instance, the masks 101 to 103 are applicable to exposure with i-line, ArF and $F_2$ light.

Furthermore, the light shielding pattern 111 of the masks 101 to 103 has been described as being made of Cr or MoSi, however, the light shielding pattern 111 may be made of a material such as MoSiON or CrON having higher trasnmittance to exposure light than Cr or MoSi, so that the masks 101 to 103 may be made so-called half-tone phase-shifting masks. In either case, the light shielding pattern 111 may be constituted by multilayer films.

Third Preferred Embodiment

In this third preferred embodiment, a computer program or CAD (Computer Aided Design) software for making the mask pattern 110 of the mask 101 to 103 will be described. An example directed to making the mask 103 (cf. FIGS. 16 to 18) will be illustrated.

Figure 22:
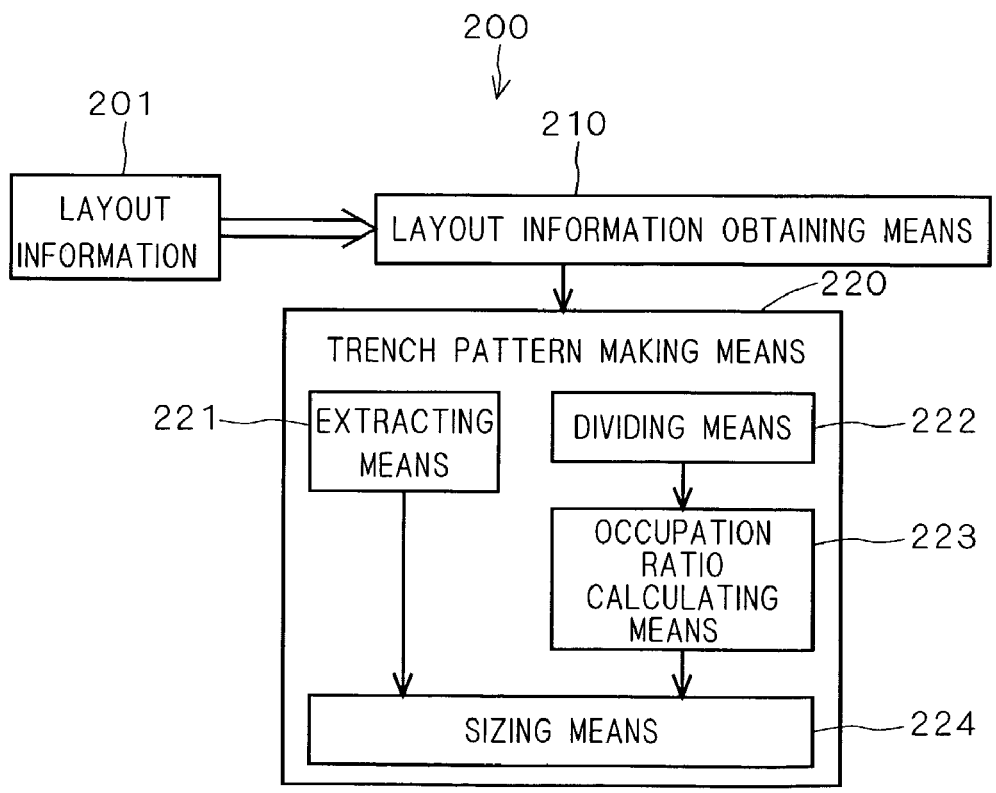
FIG. 22 is a block diagram illustrating functions of a computer according to a third preferred embodiment of the present invention.

As shown in the block diagram of FIG. 22, the above-described program is installed in a computer or CAD system 200 to cause the computer 200 to function as a device including layout information obtaining means 210 and trench pattern making means 220. The trench pattern making means 220 includes extracting means 221, dividing means 222, occupation ratio calculation means 223 and sizing means 224.

First, the layout information obtaining means 210 obtains information (hereinafter also referred to as "layout information") 201 on layout of the semiconductor device 50B through a database or operator's input (by drawing), for example. At this time, the layout information 201 to be obtained includes layout information of the via holes 51H and trenches 51T of the dual damascene structure 50 and the trenches 53T.

Next, the trench pattern making means 220 refers to (or reads) the obtained layout information 201 to make a pattern that corresponds to a layer in which the trenches 51T and 53T are provided.

Specifically, the extracting means 221 refers to (or reads) the layout information 201 to extract an area to be target of sizing on the layout of the trenches 51T based on the layout information 201. For instance, through the use of general functions of CAD software, a flag is given to an edge e (cf. FIG. 12) of a trench 51T (or interconnect line portion 52T) having a space d (cf. FIG. 12) of not greater than 70 nm from an edge of the via hole 51H on the layout based on the layout information 201.

The dividing means 222 divides the layer in which the trenches 51T and 53T are provided into the plurality of regions 120A (cf. FIGS. 16 to 18) on the layout based on the layout information 201. Dividing conditions at this time, e.g., setting of range of the region 120 (FIG. 14) and size of each region 120A, are previously stored in the program or the dividing means 222 timely prompts an operator to input such dividing conditions. Thereafter, the occupation ratio calculating means 223 calculates the occupation ratio of the via holes 51H in each region 120A. The occupation ratio calculating means 223 can make use of general functions of CAD software.

Either processing by the extracting means 221 and that by the dividing means 222 and occupation ratio calculating means 223 may be performed first.

The sizing means 224 performs undersizing for the light shielding pattern 111 in an area extracted by the extracting means 221 (e.g., in the vicinity of the portion that corresponds to the via hole 51H on the edge e of the trench 51T extracted by the extracting means 221). In the case of the mask 102 intended for a positive-type resist, the light shielding pattern 111 is subjected to oversizing. In this case, the sizing means 224 performs undersizing (or oversizing) to a greater degree in a region 120A where the aforementioned occupation ratio is higher.

Through the above-described program, the mask pattern 110 of the mask 103 (cf. FIGS. 16–18) are made. When making the mask pattern 110 of the masks 101 and 102 (cf. FIGS. 8 and 13), the dividing means 222 and occupation ratio calculating means 223 may not be provided for the program.

While the invention has been shown and described in detail, the foregoing description is in all aspects illustrative and not restrictive. It is therefore understood that numerous modifications and variations can be devised without departing from the scope of the invention.

What is claimed is:

1. A pattern transfer mask for transferring a pattern to resist when manufacturing a semiconductor device, wherein
said semiconductor device includes, in one layer, a plurality of dual damascene structures each including at least one hole, a trench extending over said at least one hole and a conductive material buried in said at least one hole and said trench, and
said pattern transfer mask is used when patterning said resist for forming said trenches,
said pattern transfer mask comprising:
a light shielding pattern subjected to one of undersizing and oversizing in the vicinity of a portion that corresponds to each of said holes; and
a light transmitting pattern having higher light transmittance than said light shielding pattern.

2. The pattern transfer mask according to claim 1, wherein said one of undersizing and oversizing is made to a greater degree in a region where said hole occupies a larger area in plan view of said semiconductor device.

3. A method of manufacturing a semiconductor device using said pattern transfer mask as recited in claim 1, comprising the steps of:
(a) forming an interlevel dielectric in which said dual damascene structures are to be formed;
(b) forming said holes in said interlevel dielectric;
(c) forming resist on said interlevel dielectric after said step (b);
(d) forming an anti-reflection film on said resist;

(e) patterning said resist after said step (d) by photolithography using said pattern transfer mask as recited in claim 1; and (f) etching said interlevel dielectric using said resist as patterned as a mask to form said trenches.

4. The pattern transfer mask of claim 1, wherein the light shielding pattern comprises a base portion having opposing sides and an undersized portion having opposing recessed edges recessed from the opposing sides of the base portion in the vicinity of a portion that corresponds to each of the holes.

5. The pattern transfer mask of claim 1 wherein the light shielding portion comprises a base portion having a design width Tw and an undersized portion having a width Tw−2H, where H equals an undersized dimension subtracted from each of the opposing sides of the base portion in the vicinity of a portion that corresponds to each of the holes.

6. The pattern transfer mask of claim 5, wherein H=0.01 μm.

7. The pattern transfer mask of claim 5, wherein H=0.02 μm.

8. The pattern transfer mask of claim 5, wherein H=0.03 μm.

9. The pattern transfer mask of claim 1, wherein the light shielding pattern comprises a base portion having opposing sides and an oversized portion having opposing protruding edges protruding from the opposing sides of the base portion in the vicinity of a portion that corresponds to each of the holes.

10. The pattern transfer mask of claim 1 wherein the light shielding portion comprises a base portion having a design width Tw and an oversized portion having a width Tw+2H, where H equals an oversized dimension added to each of the opposing sides of the base portion in the vicinity of a portion that corresponds to each of the holes.

* * * * *